US012638245B2

(12) United States Patent
Wang et al.

(10) Patent No.: US 12,638,245 B2
(45) Date of Patent: May 26, 2026

(54) HEAT DISSIPATION STRUCTURE

(71) Applicant: COOLER MASTER CO., LTD., New Taipei City (TW)

(72) Inventors: Chi-Chuan Wang, New Taipei City (TW); Chang-Yu Hsieh, New Taipei City (TW); Shan-Yin Cheng, New Taipei City (TW); Hsiang-Fen Chou, New Taipei City (TW)

(73) Assignee: COOLER MASTER CO., LTD., New Taipei City (TW)

( * ) Notice: Subject to any disclaimer, the term of this patent is extended or adjusted under 35 U.S.C. 154(b) by 178 days.

(21) Appl. No.: 18/143,988

(22) Filed: May 5, 2023

(65) Prior Publication Data

US 2023/0272980 A1 Aug. 31, 2023

Related U.S. Application Data

(62) Division of application No. 17/112,741, filed on Dec. 4, 2020, now Pat. No. 11,686,532, which is a division of application No. 15/921,623, filed on Mar. 14, 2018, now Pat. No. 10,907,907.

(30) Foreign Application Priority Data

Dec. 26, 2017 (TW) .................................. 106145694

(51) Int. Cl.
F28D 15/02 (2006.01)
F28F 3/12 (2006.01)
(Continued)

(52) U.S. Cl.
CPC ..... F28D 15/0266 (2013.01); F28D 15/0233 (2013.01); F28F 3/12 (2013.01);
(Continued)

(58) Field of Classification Search
CPC .. F28D 15/02; F28D 15/0233; F28D 15/0266; F28D 2021/0028;
(Continued)

(56) References Cited

U.S. PATENT DOCUMENTS

| 1,622,376 | A | 3/1927 | Davenport |
| 2,058,871 | A | 10/1936 | Heath |

(Continued)

FOREIGN PATENT DOCUMENTS

DE 19653956 A1 * 6/1997 ......... F28D 15/0233

*Primary Examiner* — Harry E Arant
(74) *Attorney, Agent, or Firm* — Dickinson Wright, PLLC

(57) ABSTRACT

The disclosure is related to a heat dissipation structure. The heat dissipation structure is adapted to accommodate a fluid and thermally contact a heat source. The heat dissipation structure includes a heat conductive plate and a channel arrangement. The heat conductive plate is configured to thermally contact the heat source. The channel arrangement is located on the heat conductive plate, and the channel arrangement includes a wider channel portion and a narrower channel portion. The wider channel portion is wider than the narrower channel portion, and the wider channel portion is connected to the narrower channel portion so that the channel arrangement forms a loop. The channel arrangement is configured to accommodate the fluid and allow the fluid to absorb heat generated by the heat source through the heat conductive plate so as to at least partially change phase of the fluid.

4 Claims, 8 Drawing Sheets

(51) Int. Cl.

| | | |
|---|---|---|
| *F28F 13/08* | (2006.01) | |
| *F28D 21/00* | (2006.01) | |
| *H05K 7/20* | (2006.01) | |

(52) U.S. Cl.
CPC ...... *F28F 13/08* (2013.01); *F28D 2015/0216* (2013.01); *F28D 2021/0028* (2013.01); *H05K 7/20* (2013.01); *H05K 7/20336* (2013.01)

(58) Field of Classification Search
CPC ..... F28D 2015/0216; F28F 13/08; F28F 3/12; H05K 7/20; H05K 7/20336
See application file for complete search history.

(56) References Cited

U.S. PATENT DOCUMENTS

| | | | |
|---|---|---|---|
| 2,934,322 A | | 4/1960 | Hazard |
| 3,226,602 A | | 12/1965 | Elfving |
| 3,782,134 A | | 1/1974 | Meess |
| 3,817,321 A | | 6/1974 | von Cube et al. |
| 4,550,774 A | | 11/1985 | Andes et al. |
| 4,735,609 A | | 4/1988 | Comeau et al. |
| 4,921,041 A | | 5/1990 | Akachi |
| 5,060,722 A | | 10/1991 | Zdenek |
| 5,076,350 A | | 12/1991 | Grantz et al. |
| 5,076,351 A | | 12/1991 | Munekawa et al. |
| 5,755,278 A | | 5/1998 | Shinohara et al. |
| 5,946,939 A | | 9/1999 | Matsushima et al. |
| 6,164,368 A | | 12/2000 | Furukawa et al. |
| 6,672,373 B2 | | 1/2004 | Smymov |
| 7,080,680 B2 | | 7/2006 | Ota et al. |
| 7,998,427 B2 | | 8/2011 | Guarino |
| 8,919,426 B2 | | 12/2014 | Hardesty |
| 9,423,192 B2 | | 8/2016 | Tsoi et al. |
| 10,260,819 B2 | | 4/2019 | Chou |
| 2002/0056542 A1* | | 5/2002 | Yamamoto .......... F28D 15/0233 257/E23.098 |
| 2006/0157227 A1 | | 7/2006 | Choi et al. |

\* cited by examiner

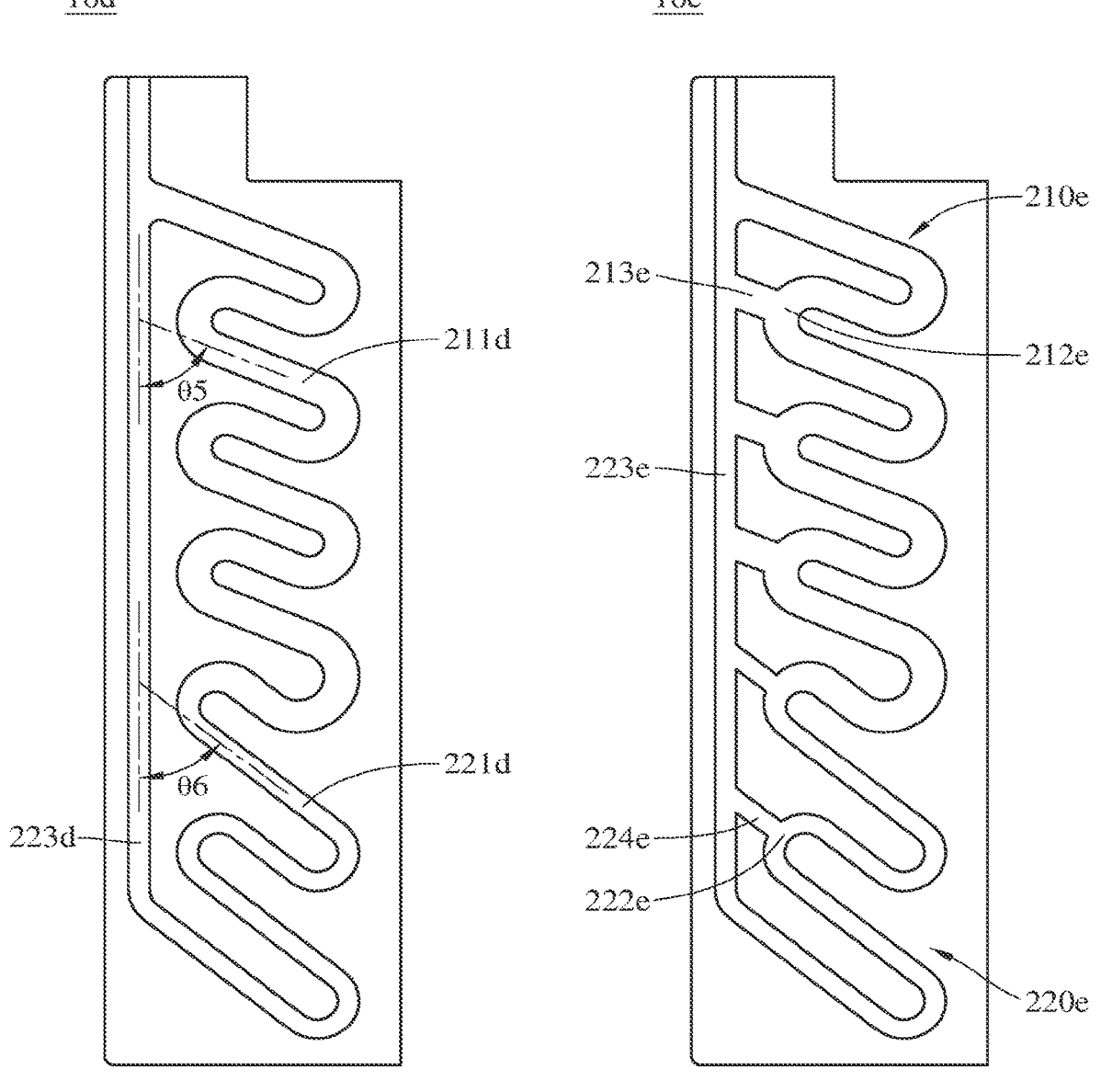
FIG. 4                    FIG. 5

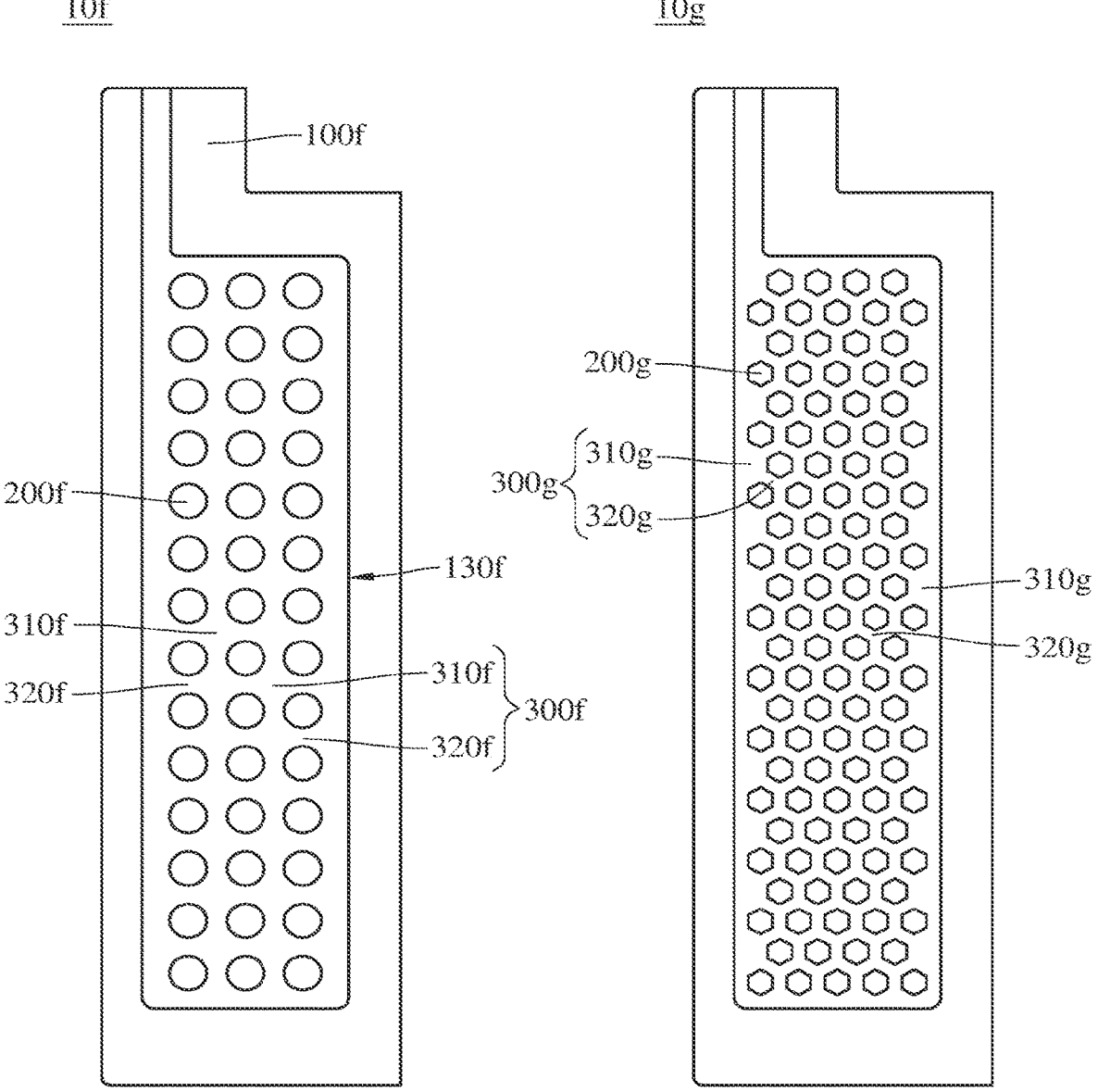
FIG. 6                    FIG. 7

HEAT DISSIPATION STRUCTURE

CROSS-REFERENCE TO RELATED APPLICATIONS

This patent application is a divisional of U.S. patent application Ser. No. 17/112,741, filed Dec. 4, 2020, which is a divisional of U.S. patent application Ser. No 15/921,623 filed Mar. 14, 2018 issued now as U.S. Pat. No. 10,907,907, which claims priority under 35 U.S.C. § 1190) on Patent Application No(s). 106145694 filed in Taiwan, R.O.C. on Dec. 26, 2017, the entire contents of which are hereby incorporated by reference.

TECHNICAL FIELD

The disclosure relates to a heat dissipation structure, more particularly to a heat dissipation structure having a wider channel portion and a narrower portion.

BACKGROUND

Work performance of electronic components increase with the progress of technology, but it also generates more heat during operation. Therefore, the electronic components with high work performance are required to cooperate with a heat dissipation device with higher-heat dissipation effect, such as an oscillating heat pipe structure. In general, the oscillating heat pipe structure is a heat conductive plate formed with a circulation channel, and the circulation channel is filled with liquid coolant. When the oscillating heat pipe structure thermally contacts the electronic component, the liquid coolant absorbs heat generated by the electronic component, such that the liquid coolant would change its phase so as to be circulated in the circulation channel, thereby decreasing the temperature of the electronic component.

SUMMARY OF THE INVENTION

One embodiment of the disclosure provides a heat dissipation structure is adapted to accommodate a fluid and thermally contact at least one heat source. The heat dissipation structure includes a heat conductive plate and a channel arrangement. The heat conductive plate is configured to thermally contact the at least one heat source. The channel arrangement is located on the heat conductive plate, and the channel arrangement includes a wider channel portion and a narrower channel portion. The width of the wider channel portion is wider than the width of the narrower channel portion, and the wider channel portion is connected to the narrower channel portion so that the channel arrangement forms a loop. The channel arrangement is configured to accommodate the fluid, and allow the fluid to absorb heat generated by the at least one heat source through the heat conductive plate so as to at least partially change phase of the fluid.

One embodiment of the disclosure provides a heat dissipation structure is adapted to accommodate a fluid and thermally contact at least one heat source. The heat dissipation structure includes a heat conductive plate and a plurality of split structures. The heat conductive plate is configured to thermally contact the at least one heat source. The heat conductive plate has a fluid storage chamber. The split structures are dent on the heat conductive plate so as to divide the fluid storage chamber into a plurality of wider channels and a plurality of narrower channels that are connected to one another so as to form a channel arrangement. Each of the wider channels is wider than each of the narrower channels. The channel arrangement is configured to accommodate the fluid, and allow the fluid to absorb heat generated by the at least one heat source through the heat conductive plate so as to at least partially change phase of the fluid.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein:

FIG. 4 is a front view of a heat dissipation structure according to a fourth embodiment of the disclosure;

FIG. 5 is a front view of a heat dissipation structure according to a fifth embodiment of the disclosure;

FIG. 6 is a front view of a heat dissipation structure according to a sixth embodiment of the disclosure;

FIG. 7 is a front view of a heat dissipation structure according to a seventh embodiment of the disclosure;

DETAILED DESCRIPTION

Figure 1:
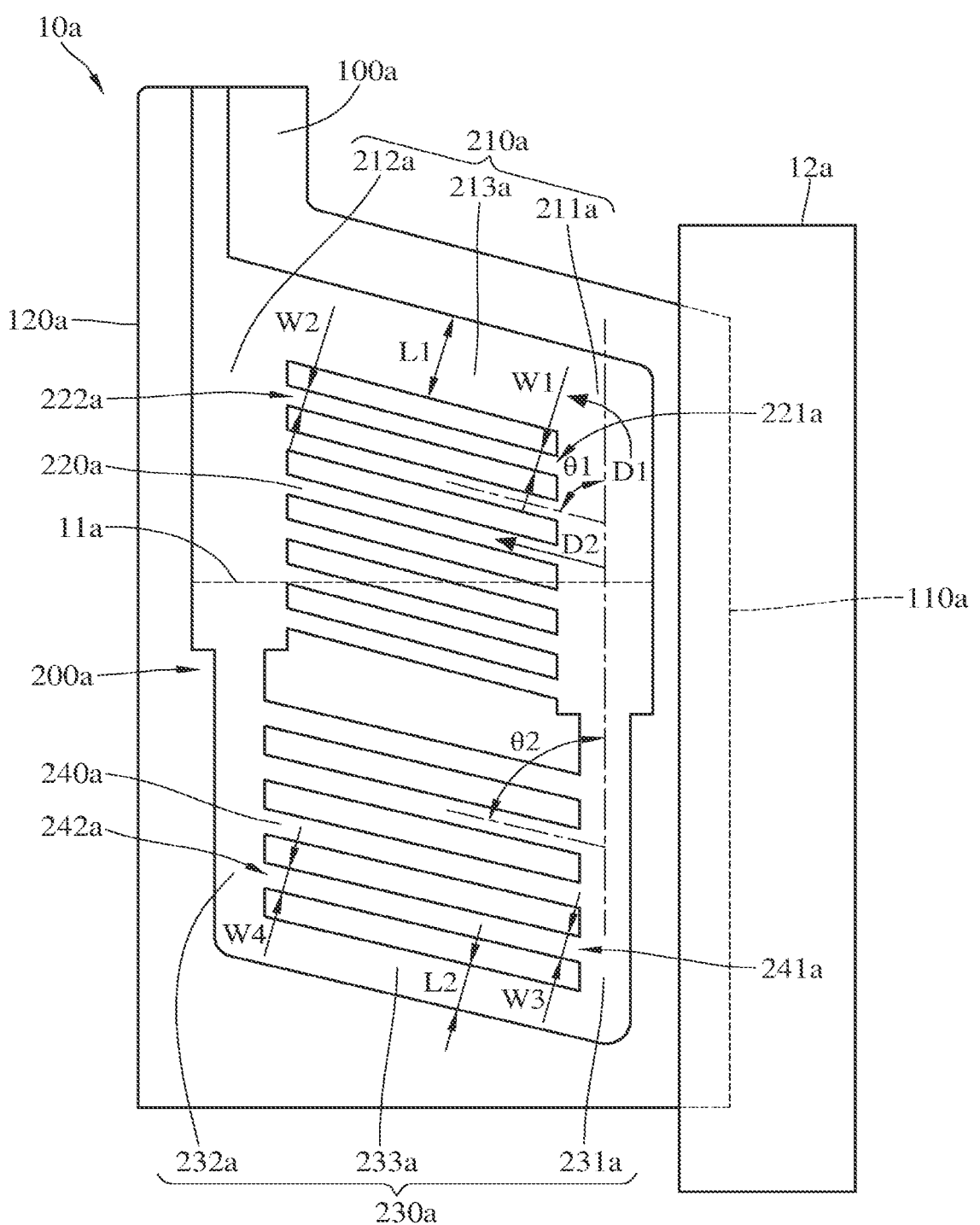
FIG. 1 is a front view of a heat dissipation structure according to a first embodiment of the disclosure while the heat dissipation structure is in thermal contact with a heat source.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1. FIG. 1 is a front view of a heat dissipation structure according to a first embodiment of the disclosure while the heat dissipation structure is in thermal contact with a heat source.

This embodiment provides a heat dissipation structure 10a, and the heat dissipation structure 10a is adapted to accommodate a fluid 11a and thermally contact a heat source 12a. The fluid 11a is coolant. The heat source 12a is, for example, a CPU. In practical experience, the boiling temperature of the coolant falls within a temperature interval of a normally operating CPU; that is, the temperature of the normally operating CPU can boil the coolant, in order to prevent the CPU from failure due to overly high temperature. For example, the boiling temperature of the coolant is 50° C., and the CPU can normally operate in a temperature ranging between 40° C. and 65° C. In this embodiment, the heat dissipation structure 10a includes a heat conductive plate 100a and a channel arrangement 200a.

The heat conductive plate 100a has a heat absorbing edge 110a and a condensing edge 120a opposite to each other. The heat absorbing edge 110a is configured to thermally contact the heat source 12a. The channel arrangement 200a is located on the heat conductive plate 100a and configured for the circulation of the fluid 11a and the gaseous form thereof. In detail, the channel arrangement 200a includes a wider channel portion 210a, a plurality of first connecting channels 220a, a narrower channel portion 230a and a plurality of second connecting channels 240a.

The wider channel portion 210a includes a first wider channel 211a, a second wider channel 212a, and a third wider channel 213a. The first wider channel 211a and the second wider channel 212a are respectively close to the heat absorbing edge 110a and the condensing edge 120a, and two opposite ends of the third wider channel 213a are respectively connected to the first wider channel 211a and the second wider channel 212a.

Two opposite ends of each first connecting channel 220a are respectively connected to the first wider channel 211a and the second wider channel 212a. Each first connecting channel 220a forms an first acute angle θ1 with respect to the first wider channel 211a, and the first angle θ1, in this embodiment, ranges between 10 degrees and 90 degrees. Each first connecting channel 220a has two first ports 221a and 222a opposite to each other, and the first ports 221a and 222a are respectively connected to the first wider channel 211a and the second wider channel 212a. In each first connecting channel 220, a width W2 of the first port 222a connected to the second wider channel 212a is equal to a width W1 of the first port 221a connected to the first wider channel 211a. That is, the width of the first connecting channel 220a is maintained at the same size from the condensing edge 120a to the heat absorbing edge 110a.

The narrower channel portion 230a includes a first narrower channel 231a, a second narrower channel 232a, and a third narrower channel 233a. The first narrower channel 231a and the second narrower channel 232a are respectively close to the heat absorbing edge 110a and the condensing edge 120a, and respectively connected to two opposite ends of the third narrower channel 233a. An end of the first narrower channel 231a away from the third narrower channel 233a is connected to the first wider channel 211a, and an end of the second narrower channel 232a away from the third narrower channel 233a is connected to the second wider channel 212a, so that the channel arrangement 200a forms a loop. In this embodiment, the wider channels 211a-213a of the wider channel portion 210a are the same in width (e.g., a width L1), the narrower channels 231a-233a of the narrower channel portion 230a are also the same in width (e.g., a width L2), and the width L1 is greater than the width L2. That is, the wider channel portion 210a is wider than the narrower portion 230a.

Two opposite ends of each second connecting channel 240a are respectively connected to the first narrower channel 231a and the second narrower channel 232a. Each second connecting channel 240a forms an second acute angles θ2 with respect to the first narrower channel 231a, and the second acute angle θ2, in this embodiment, ranges between 10 degrees and 90 degrees.

In this embodiment, the first acute angle θ1 between the first connecting channel 220a and the first wider channel 211a is equal to the second acute angle θ2 between the second connecting channel 240a and the first narrower channel 231a, but the present disclosure is not limited thereto. In some other embodiments, an angle between each first connecting channel and the first wider channel may be greater or smaller than an angle between each second connecting channel and the first narrower channel.

In addition, the first acute angles θ1 between the first connecting channels 220a and the first wider channel 211a are fixed at a specific value, but the present disclosure is not limited thereto. In some other embodiments, the angles between the first connecting channels and the first wider channel may vary. In the same manner, the second acute angles θ2 between the second connecting channels 240a and the first narrower channel 231a may be fixed or varied according to actual requirements.

Each of the second connecting channels 240a has two second ports 241a and 242a opposite to each other. The second ports 241a and 242a are respectively connected to the first narrower channel 231a and the second narrower channel 232a. In each second connecting channel 240a, a width W4 of the second port 242a connected to the second narrower channel 232a is equal to a width W3 of the second port 241a connected to the first narrower channel 231a. That is, the width of the second connecting channel 240a is maintained at the same size from the condensing edge 120a to the heat absorbing edge 110a.

In this embodiment, the channel arrangement 200a is configured to accommodate the fluid 11a and allow the fluid 11a to absorb heat generated by the heat source 12a through the heat conductive plate 100a so as to at least partially change phase of the fluid 11a. More specifically, when the fluid 11a absorbs heat near the heat absorbing edge 110a, it would be vaporized to be gaseous and naturally move toward the condensing edge 120a through the first wider channel 211a and the first connecting channels 220a along two directions D1 and D2 by the means of the rising characteristic of high temperature gas. Then, the gaseous fluid 11a reaching the condensing edge 120a would be condensed into liquid form via a thermal energy exchange between it and outer environment, and then the condensed fluid 11a would fall and return to the side near the heat absorbing edge 110a through the narrower channel portion 230a with the assistance of the gravity. As such, the fluid 11a is able to continuously absorb heat near the heat absorbing edge 110a.

In this embodiment, when the gaseous fluid 11a is flowing in the wider channel portion 210a, the resistance of the wider channels 211a-213a is relatively small because the wider channels 211a-213a are wider, such that the flowing velocity of the gaseous fluids 11a is increased, thereby accelerating the circulation of the fluid and improving the heat dissipation capability of the heat dissipation structure 10a.

In addition, the narrower channel portion 230a having relative smaller width is beneficial to create a capillary action when the fluid 11a is flowing therethrough, which helps the fluid 11a to flow more smoothly and fast in the narrower channel portion 230a, thereby improving the heat dissipation capability of the heat dissipation structure 10a.

Moreover, the first acute angles θ1 between the first connecting channels 220a and the first wider channel 211a and the second acute angles θ2 between the second connecting channels 240a and the first narrower channel 231a help that the gaseous fluid 11a to move toward the condensing edge 120a through the first connecting channels 220a, and the condensed fluid 11a to return to the heat absorbing edge 110a through the second connecting channel 240a. Therefore, it helps to improve the circulation of the fluid 11a in the channel arrangement 200a so as to improve the heat dissipation capability of the heat dissipation structure 10a.

Furthermore, due to the narrower channel portion 230*a* of the channel arrangement 200*a*, the usage of the fluid 11*a* being filled into the channel arrangement 200*a* is able to be decreased, helping to decrease the cost of the fluid 11*a*.

In the wider channel portion 210*a* of this embodiment, the wider channels 211-213 are the same in width (e.g., the widths L1), but the present disclosure is not limited thereto. In some other embodiments, the wider channels may be different in width. By doing so, it is able to increase the pressure driving force, such that the imbalance force produced in the channel arrangement is able to accelerate the speed of the cooling circulation so as to further improve the heat dissipation capability of the heat dissipation structure. The aforementioned imbalance force is produced by ΔP in Young-Laplace formula, $$\Delta P = \sigma \left( \frac{1}{R_1} - \frac{1}{R_2} \right),$$

wherein R1 and R2 are respectively the radii of two pipes, σ is the surface tension of a fluid, and ΔP is the pressure driving force causing by variation of pipe width. In addition, similarly, the widths of the narrower channels and widths of the connecting channels may be different.

In this embodiment, the channel arrangement 200*a* has only one wider channel portion 210*a* and one narrower channel portion 230*a*, but the present disclosure is not limited thereto. In some other embodiments, the quantity of the wider channel portion and the narrower channel portion may be adjusted in accordance with the size of the heat conductive plate in order to uniformly conducted away heat generated by the heat source so as to enhancing the efficiency of heat dissipation.

Figure 2:
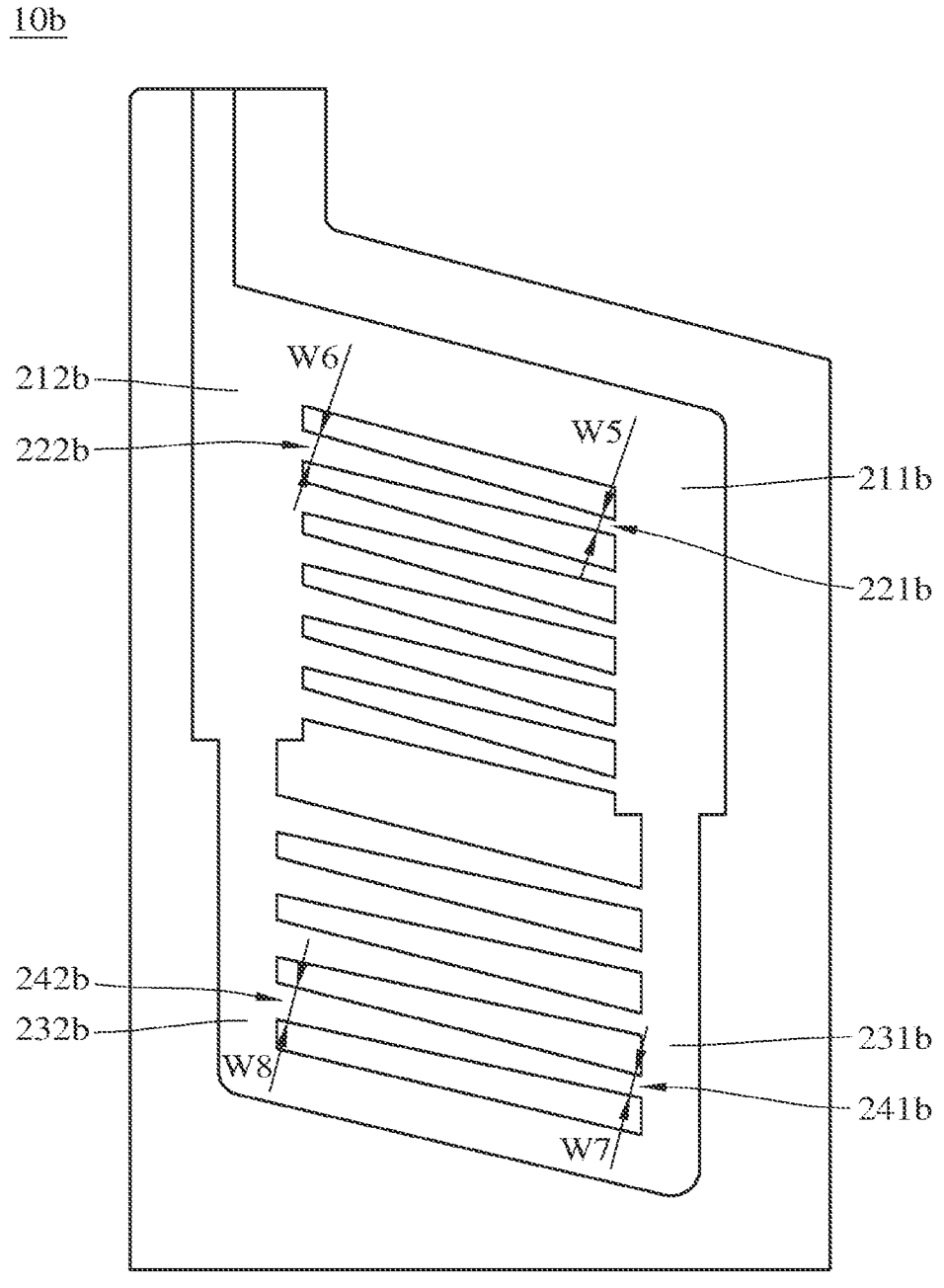
FIG. 2 is a front view of a heat dissipation structure according to a second embodiment of the disclosure.

In this embodiment, the width W1 of the first port 221*a* is equal to the width W2 of the first port 222*a*, and the width W3 of the second port 241*a* is equal to the width W4 of the second port 242*a*, but the present disclosure is not limited thereto. Please refer to FIG. 2. FIG. 2 is a front view of a heat dissipation structure according to a second embodiment of the disclosure.

This embodiment provides a heat dissipation structure 10*b*. In the heat dissipation structure 10*b*, a width W6 of each first port 222*b* connected to a second wider channel 212*b* is greater than a width W5 of each first port 221*b* connected to a first wider channel 211*b*, and a width W8 of each second port 242*b* connected to a second narrower channel 232*b* is greater than a width W7 of each second port 241*b* connected to a first narrower channel 231*b*. That is, each first port 222*b* is wider than each first port 221*b*, and each second port 242*b* is wider than each second port 241*b*.

Figure 3:
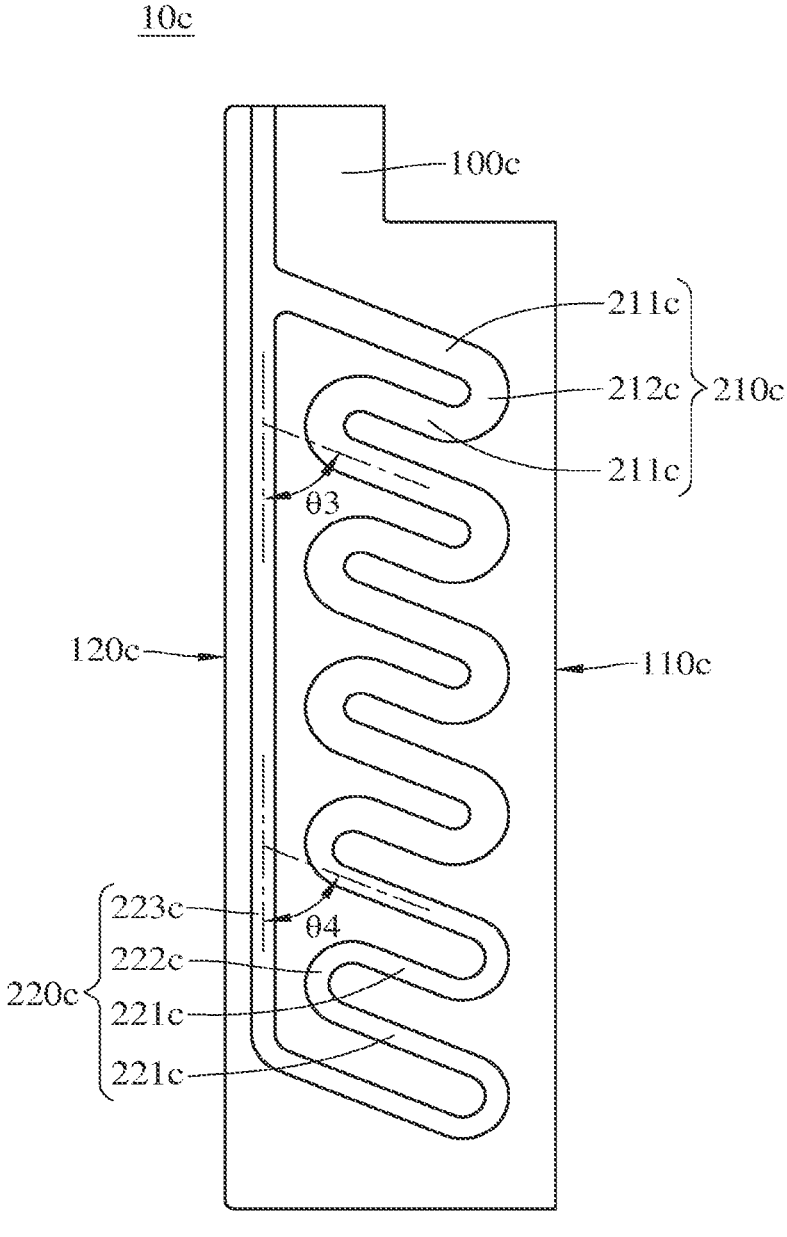
FIG. 3 is a front view of a heat dissipation structure according to a third embodiment of the disclosure.

In the previous embodiments, the wider channels 211*a*-213*a*, the narrower channels 231*a*-233*a*, and connecting channels 220*a* and 240*a* of the channel arrangement 200*a* are all in straight, but the present disclosure is not limited thereto. Please refer to FIG. 3. FIG. 3 is a front view of a heat dissipation structure according to a third embodiment of the disclosure.

This embodiment provides a heat dissipation structure 10*c*, the heat dissipation structure 10*c* has a wider channel portion 210*c* including a plurality of first inclined channels 211*c* and a plurality of first curved channels 212*c*. Two opposite ends of each first curved channel 212*c* are respectively connected to two of the first inclined channels 211*c*. The first curved channels 212*c* and the first inclined channels 211*c* are arranged along a heat absorbing edge 110*c*, wherein the first inclined channels 211*c* are arranged spaced apart from each other and crosswise from the heat absorbing edge 110*c* to a condensing edge 120*c*. In addition, the heat dissipation structure 10*c* further has a narrower channel portion 220*c* including a plurality of second inclined channels 221*c*, a plurality of second curved channels 222*c* and a returning channel 223*c*. Two opposite ends of each second curved channel 222*c* are respectively connected to two of the second inclined channels 221*c*. The second curved channels 222*c* and the second inclined channels 221*c* are arranged along the heat absorbing edge 110*c*, wherein the second inclined channels 221*c* are arranged spaced apart from each other and crosswise from the heat absorbing edge 110*c* to the condensing edge 120*c*. The returning channel 223*c* is closer to the condensing edge 120*c* than the first inclined channels 211*c* and the second inclined channels 221*c*, and two opposite ends of the returning channel 223*c* are respectively connected to one of the first inclined channels 211*c* and one of the second inclined channels 221*c* that are respectively located at two opposite sides of a heat conductive plate 100*c*. An angle θ4 between each second inclined channel 221*c* and the returning channel 223*c* is equal to an angle θ3 between each first inclined channel 211*c* and the returning channel 223*c*. That is, the second inclined channels 221*c* and the first inclined channels 211*c* have the same inclination, but the present closure is not limited thereto.

Please refer to FIG. 4. FIG. 4 is a front view of a heat dissipation structure according to a fourth embodiment of the disclosure. This embodiment provides a heat dissipation structure 10*d*. In the heat dissipation structure 110*d*, an angle θ6 between each second inclined channels 221*d* and a returning channel 223*d* is smaller than an angle θ5 between each first inclined channel 211*d* and the returning channel 223*d*. That is, the second inclined channels 221*d* are more inclined than the first inclined channels 211*d*.

In the embodiment in FIG. 3, the first curved channels 212*c* and the second curved channels 222*c* are connected to the returning channel 223*c* through inclined channels 211*c* and 221*c*, but the present disclosure is not limited thereto.

Please refer to FIG. 5. FIG. 5 is a front view of a heat dissipation structure according to a fifth embodiment of the disclosure.

This embodiment provides a heat dissipation structure 10*e*. The heat dissipation structure 10*e* has a wider channel portion 210*e* including a plurality of first connecting channels 213*e*, and two opposite ends of each first connecting channel 213*e* are respectively connected to a returning channel 223*e* and one of first curved channels 212*e* near the returning channel 223*e*. In addition, a narrower channel portion 220*e* further includes a plurality of second connecting channels 224*e*, and two opposite ends of each second connecting channel 224*e* are respectively connected to the returning channel 223*e* and one of second curved channels 222*e* near the returning channel 223*e*.

In this embodiment, a part of the first curved channels 212*e* and a part of the second curved channels 222*e* are respectively connected to the returning channel 223*e* through the first connecting channels 213*e* and the second connecting channels 224*e*, but the present disclosure is not limited thereto. In some other embodiment, a part of the first curved channels near the returning channel and a part of the second curved channels near the returning channel may be directly connected to the returning channel.

Then, please refer to FIG. 6. FIG. 6 is a front view of a heat dissipation structure according to a sixth embodiment of the disclosure.

This embodiment provides a heat dissipation structure 10*f* including a heat conductive plate 100*f* and a plurality of split structures 200*f*. The heat conductive plate 100*f* has a fluid storage chamber 130*f*. The split structures 200*f* are arranged in an array, and are dent on the heat conductive plate 100*f* so as to divide the fluid storage chamber 130*f* into a plurality of wider channels 310*f* and a plurality of narrower channels 320*f* that are connected to one another so as to form a channel arrangement 300*f*. In other word, the split structures 200*f* are dent on the heat conductive plate 100*f*, such that the channel arrangement 300*f* having the wider channels 310*f* and the narrower channels 320*f* is formed from the fluid storage chamber 130*f*. Furthermore, in this embodiment, each split structure 200*f* is in circular shape, but the present disclosure is not limited thereto.

Please refer to FIG. 7. FIG. 7 is a front view of a heat dissipation structure according to a seventh embodiment of the disclosure. This embodiment provides a heat dissipation structure 10*g*. The heat dissipation structure 10*g* includes a plurality of split structures 200*g* which are arranged in a staggered arrangement, and each split structure 200*g* is in hexagonal shape. In more detail, a plurality of wider channels 310*g* and a plurality of narrower channels 320*g* are formed between the split structures 200*g*, and the wider channels 310*g* and the narrower channels 320*g* together form a channel arrangement 300*g*.

Figure 8:
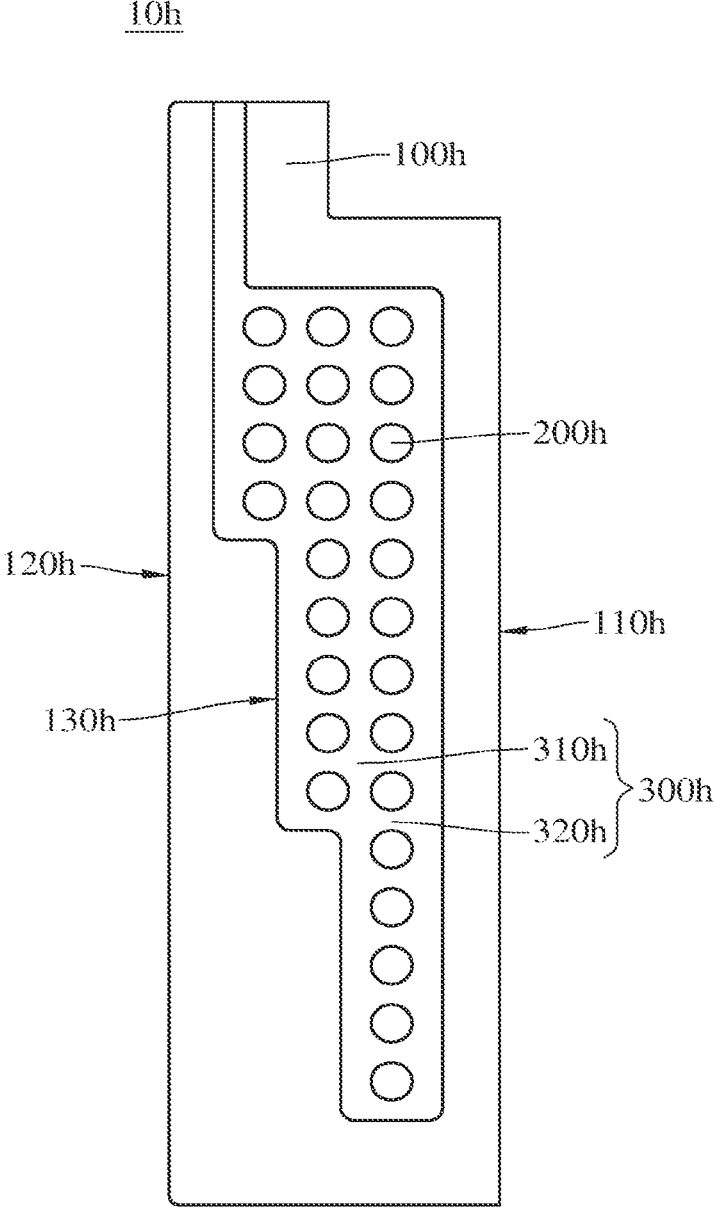
FIG. 8 is a front view of a heat dissipation structure according to an eighth embodiment of the disclosure.

In the split structures in FIG. 6 and FIG. 7, the quantity of the split structures near the heat absorbing edge is equal to the quantity of the split structures near the condensing edge, but the present disclosure is not limited thereto. Please refer to FIG. 8. FIG. 8 is a front view of a heat dissipation structure according to an eighth embodiment of the disclosure. In a heat dissipation structure 10*h* of this embodiment, the quantity of the split structures 200*h* near the heat absorbing edge 110*h* is greater than the quantity of the split structures 200*h* near the condensing edge 120*h*. In other words, a part of the split structures 200*h* near the heat absorbing edge 110*h* is more than another part of the split structures 200*h* near the condensing edge 120*h*; that is, there are more split structures 200*h* near the heat absorbing edge 110*h* than the condensing edge 120*h*. The split structures 200*h* are dent on a heat conductive plate 100*h* so as to divide a fluid storage chamber 130*h* into a plurality of wider channels 310*h* and a plurality of narrower channels 320*h* that are connected to one another so as to form a channel arrangement 300*h*.

Figure 9:
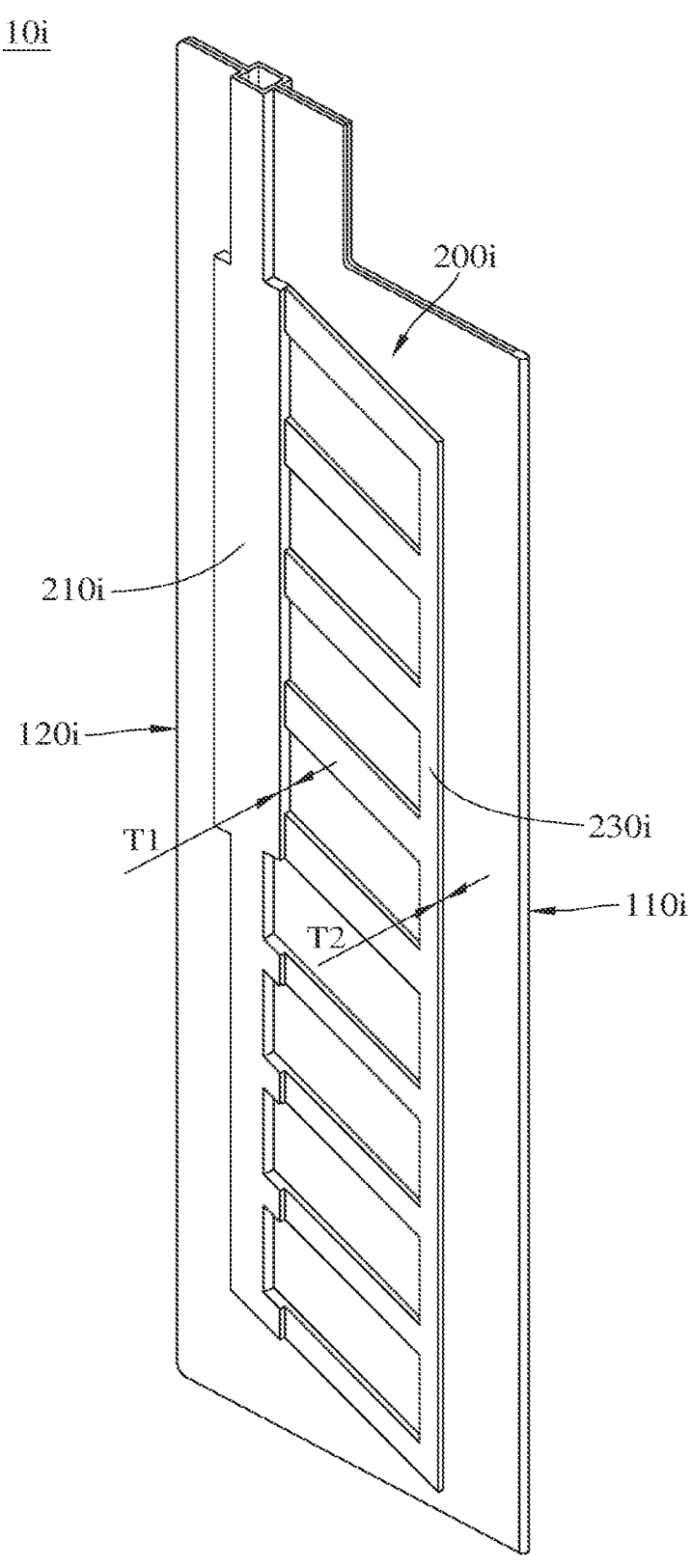
FIG. 9 is a front view of a heat dissipation structure according to a ninth embodiment of the disclosure.

In the previous embodiments, the thickness of each channel arrangement is fixed, but the present disclosure is not limited thereto. Please refer to FIG. 9. FIG. 9 is a front view of a heat dissipation structure according to a ninth embodiment of the disclosure.

This embodiment provides a heat dissipation structure 10*i*. The heat dissipation structure 10*i* includes a channel arrangement 200*i* including a wider channel portion 210*i* and a narrower channel portion 230*i*. The wider channel portion 210*i* and the narrower channel portion 230*i* are connected to each other to form a loop for the gaseous fluid to be circulated in the channel arrangement 200*i*. In addition, in this embodiment, a thickness T1 of a side of the channel arrangement 200*i* near a condensing edge 120*i* is greater than a thickness T2 of a side of the channel arrangement 200*i* near a heat absorbing edge 110; that is, the side of the channel arrangement 200*i* near the condensing edge 120*i* is thicker than the side of the channel arrangement 200*i* near the heat absorbing edge 110.

Figure 10:
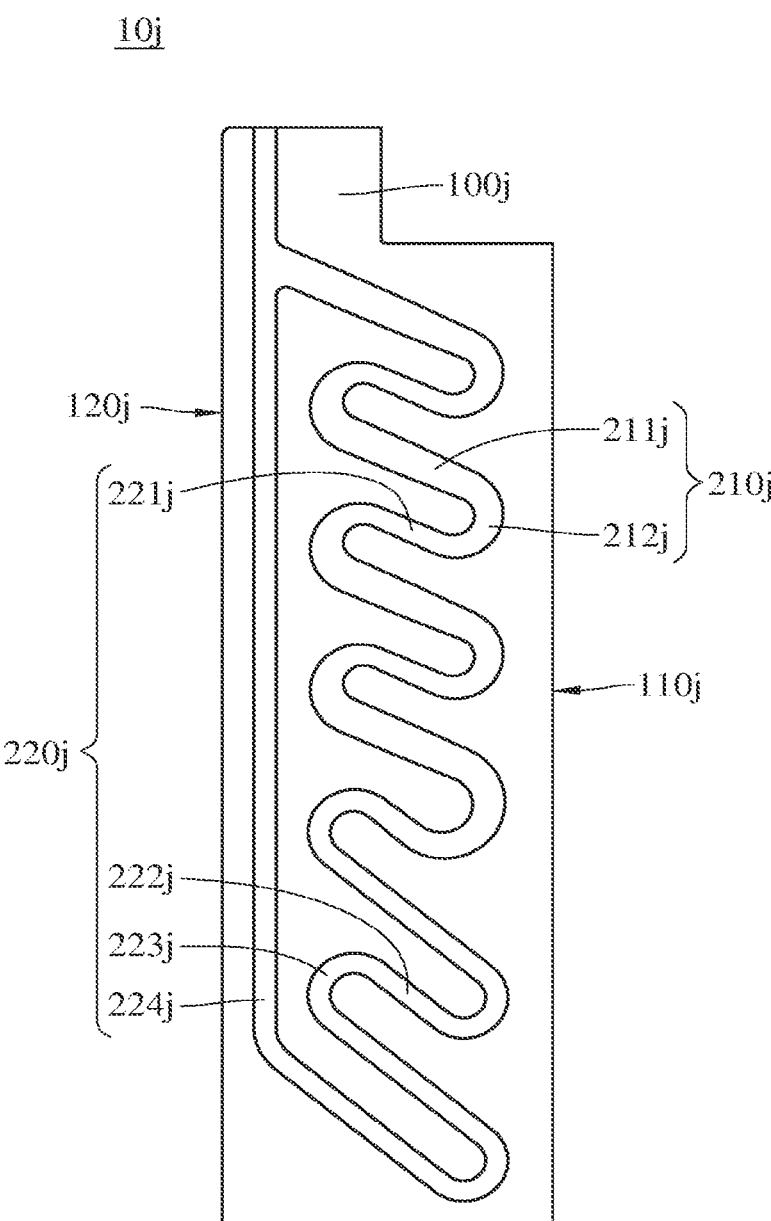
FIG. 10 is a front view of a heat dissipation structure according to a tenth embodiment of the disclosure.

Furthermore, please refer to FIG. 10. FIG. 10 is a front view of a heat dissipation structure according to a tenth embodiment of the disclosure.

This embodiment provides a heat dissipation structure 10*j*. The heat dissipation structure 10*j* includes a wider channel portion 210*j*, which includes a plurality of first inclined channels 211*j* and a plurality of first curved channels 212*j*, and a narrower channel portion 220*j*, which includes a plurality of second inclined channels 221*j*, a plurality of third inclined channels 222*j*, a plurality of second curved channels 223*j* and a returning channel 224*j*. The first inclined channels 211*j*, the second inclined channels 221*j* and the third inclined channels 222*j* are arranged along a heat absorbing edge 110*j*; in more detail, the first inclined channels 211*j*, the second inclined channels 221*j* and the third inclined channels 222*j* are arranged spaced apart from each other and crosswise from the heat absorbing edge 110*j* and a condensing edge 120*j*. The first inclined channels 211*j* and the second inclined channels 221*j* are arranged in a staggered arrangement; that is, one of the first inclined channels 211*j* is located between two of the second inclined channels 221*j*. The third inclined channels 222*j* are located on the same side of the first inclined channels 211*j* and the second inclined channels 221*j*. Each of the first curved channels 212*j* is connected to one of the first inclined channels 211*j* and one of the second inclined channels 221*j* that are adjacent to each other, and each of the second curved channels 223*j* is connected to two of the third inclined channels 222*j* that are adjacent to each other. The returning channel 224*j* is closer to the condensing edge 120*j* than the first inclined channels 211*j*, the second inclined channel 221*j* and the third inclined channels 222*j*, and two opposite ends of the returning channel 224*j* are respectively connected to one of the first inclined channels 211*j* and one of the third inclined channels 222*j* that are respectively located at two opposite sides of the heat conductive plate 100*j*.

According to the heat dissipation structure as discussed above, the resistance to the gaseous fluid flowing in the wider channel portion is relatively small because the wider channels are wider, such that the flowing velocity of the gaseous fluids is increased, thereby accelerating the circulation of the fluid and improving the heat dissipation capability of the heat dissipation structure.

In addition, the narrower channel portion having relative smaller width is beneficial to create a capillary action when the fluid is flowing therethrough, which helps the fluid to flow more smoothly and fast in the narrower channel portion, thereby improving the heat dissipation capability of the heat dissipation structure.

Moreover, the acute angles between the first connecting channels and the first wider channel and the acute angles between the second connecting channels and the first narrower channel help that the gaseous fluid to move toward the condensing edge through the first connecting channel, and the condensed fluid to return to the heat absorbing edge through the second connecting channel. Therefore, it helps to improve the circulation of the fluid in the channel arrangement so as to improve the heat dissipation capability of the heat dissipation structure.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A heat dissipation structure, adapted to accommodate a fluid and thermally contact at least one heat source, comprising:

a heat conductive plate thermally contacting the at least one heat source at a heat absorbing edge which is opposite a condensing edge in a transverse direction, and the heat conductive plate having a fluid storage chamber, and a plurality of split structures dent on the heat conductive plate so as to divide the fluid storage chamber into a plurality of wider channels and a plurality of narrower channels that are connected to one another so as to form a channel arrangement, each of the plurality of wider channels is wider than each of the plurality of narrower channels, and the channel arrangement configured to accommodate the fluid, allowing the fluid to absorb heat generated by the at least one heat source through the heat conductive plate so as to at least partially change phase of the fluid;

wherein each of the plurality of split structures is hexagonal in shape; wherein the fluid storage chamber has a thickness direction and transverse direction is perpendicular to the thickness direction, the plurality of split structures are arranged in an array in the transverse direction, the heat absorbing edge is on one side of the fluid storage chamber in the transverse direction, and the condensing edge is on an opposite side of the fluid storage chamber in the transverse direction, and wherein the heat absorbing edge in thermal contact with the heat source is present on only one side of the fluid storage chamber in the transverse direction.

2. The heat dissipation structure according to the claim 1, wherein the plurality of split structures are arranged in an array.

3. The heat dissipation structure according to the claim 1, wherein the split structures are arranged in a staggered arrangement.

4. The heat dissipation structure according to the claim 1, wherein the heat conductive plate has a heat absorbing edge and a condensing edge opposite to each other, and a number of the plurality of split structures near the heat absorbing edge is more than a number of the plurality of split structures near the condensing edge.

* * * * *